(12) United States Patent
Chi et al.

(10) Patent No.: US 10,763,342 B2
(45) Date of Patent: Sep. 1, 2020

(54) SEMICONDUCTOR DEVICES HAVING EQUAL THICKNESS GATE SPACERS

(71) Applicants: INTERNATIONAL BUSINESS MACHINES CORPORATION, Armonk, NY (US); GLOBALFOUNDRIES Inc., Grand Cayman (KY)

(72) Inventors: Cheng Chi, Jersey City, NJ (US); Ruilong Xie, Niskayuna, NY (US)

(73) Assignees: Interanational Business Machines Corporation, Armonk, NY (US); GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/216,356

(22) Filed: Dec. 11, 2018

(65) Prior Publication Data

US 2019/0123167 A1    Apr. 25, 2019

Related U.S. Application Data

(62) Division of application No. 15/437,840, filed on Feb. 21, 2017, now Pat. No. 10,170,585.

(51) Int. Cl.
*H01L 29/66* (2006.01)
*H01L 27/092* (2006.01)
(Continued)

(52) U.S. Cl.
CPC ........ *H01L 29/6656* (2013.01); *H01L 21/285* (2013.01); *H01L 21/3105* (2013.01);
(Continued)

(58) Field of Classification Search
CPC .............. H01L 21/285; H01L 21/3105; H01L 21/823821; H01L 21/823878;
(Continued)

(56) References Cited

U.S. PATENT DOCUMENTS 7,696,542 B2   4/2010  Clevenger et al.
9,147,683 B2   9/2015  Basker et al.
(Continued)

OTHER PUBLICATIONS

List of IBM Patents or Patent Applications Treated as Related dated Dec. 11, 2018, 2 pages.
(Continued)

*Primary Examiner* — Joseph M Galvin, III
(74) *Attorney, Agent, or Firm* — Tutunjian & Bitetto, P.C.; Jennifer R. Davis

(57) ABSTRACT

A method is presented for forming equal thickness gate spacers for a CMOS (complementary metal oxide semiconductor) device, the method includes forming a PFET (p-type field effect transistor) device and an NFET (n-type field effect transistor) device each including gate masks formed over dummy gates, forming PFET epi growth regions between the dummy gates of the PFET device, forming NFET epi growth regions between the dummy gates of the NFET device, depositing a nitride liner and an oxide over the PFET and NFET epi growth regions, the nitride liner and oxide extending up to the gate masks, and removing the dummy gates and the gate masks to form HKMGs (high-k metal gates) between the PFET and NFET epi growth regions.

18 Claims, 14 Drawing Sheets

(51) Int. Cl.
*H01L 29/06* (2006.01)
*H01L 21/8238* (2006.01)
*H01L 21/285* (2006.01)
*H01L 21/3105* (2006.01)
*H01L 21/768* (2006.01)
*H01L 21/8234* (2006.01)

(52) U.S. Cl.
CPC .......... *H01L 21/76837* (2013.01); *H01L 21/823814* (2013.01); *H01L 21/823821* (2013.01); *H01L 21/823864* (2013.01); *H01L 21/823878* (2013.01); *H01L 27/092* (2013.01); *H01L 27/0924* (2013.01); *H01L 29/0649* (2013.01); *H01L 29/66545* (2013.01); *H01L 29/66628* (2013.01); *H01L 21/823425* (2013.01)

(58) Field of Classification Search
CPC ............ H01L 27/0924; H01L 29/0649; H01L 29/66545; H01L 29/6656
See application file for complete search history.

(56) References Cited

U.S. PATENT DOCUMENTS

| | | | |
|---|---|---|---|
| 2006/0001104 A1* | 1/2006 | Ookura | H01L 21/76224 |
| | | | 257/368 |
| 2011/0037125 A1 | 2/2011 | Cheng et al. | |
| 2011/0049630 A1 | 3/2011 | Majumdar et al. | |
| 2013/0015525 A1 | 1/2013 | Cheng et al. | |
| 2014/0367788 A1* | 12/2014 | Xie | H01L 27/092 |
| | | | 257/369 |
| 2015/0228654 A1 | 8/2015 | Khakifirooz et al. | |
| 2016/0099322 A1 | 4/2016 | Cheng et al. | |
| 2017/0365604 A1* | 12/2017 | Suh | H01L 21/823807 |

OTHER PUBLICATIONS

Cornu-Fruleux et al., "Spacer-First Damascene-Gate FinFET Architecture Featureing Stringer-Free Integration", IEE Electron Device Letters, vol. 28, No. 6. Jun. 1, 2007. pp. 523-526.

Kanamoto et al., "Structure optimization for timing in nano scale FinFET", IEICE Electronics Express, vol. 12, No. 9. Apr. 17, 2015. pp. 1-6.

* cited by examiner

SEMICONDUCTOR DEVICES HAVING EQUAL THICKNESS GATE SPACERS

BACKGROUND

Technical Field

The present invention relates generally to semiconductor devices, and more specifically, to forming semiconductor devices having equal thickness gate spacers.

Description of the Related Art

In CMOS (complementary metal oxide semiconductor) technologies, NFET (n-type field effect transistor) and PFET (p-type field effect transistor) devices are optimized to achieve required design performance. This optimization can include doping concentrations, material selections and dimensions. For example, in conventional CMOS technologies, and particularly in dual epi process schemes for source and drain formation, both the NFET and PEET devices share many of the same processes and topology to reduce manufacturing costs. However, in current process schemes, and in particular dual epi process schemes, the spacer thickness of the NFET and PFET devices are different, with the NFET device having a thicker spacer than the PFET devices. This thicker spacer leads to degraded device performance due to longer proximity to the channel. In addition, as gate pitch scales below 50 nm, there's no room to optimize the device performance with unequal spacer thickness. To provide maximum space for gate and source/drain, spacer thickness is almost close to minimum insulator thickness required for reliability requirement (such as contact to gate breakdown) for both NFET and PFET, and they have to be equal or significantly close in thickness.

SUMMARY

In accordance with an embodiment, a method is provided for forming equal thickness gate spacers for PFET (p-type field effect transistor) and NFET (n-type field effect transistor) devices. The method includes depositing at least a first dielectric layer to pinch-off space between gates, recessing the first dielectric layer such that a first gate hard mask is exposed, depositing a first conformal atomic layer deposition (ALD) layer or depositing a first directed self-assembly (DSA) layer adjacent gate masks of the PFET and NFET devices, masking the NFET device and etching the first dielectric layer in a PFET region using the first ALD layer or the first DSA layer as a mask to form a PFET spacer, and forming PFET epi growth regions. The method further includes depositing a first nitride liner and a first inter-level dielectric (ILD) over the PFET and NFET devices, recessing the ILD and the nitride liner to reveal a second gate hard mask, depositing a second conformal ALD layer or depositing a second DSA layer adjacent the gate masks of the PFET and NFET devices, and masking the PFET device and etching the first dielectric layer in NFET region using the second ALD layer or the second DSA layer as a mask to form an NFET spacer. The method further includes forming NFET epi growth regions, depositing a second nitride liner and a second inter-level dielectric (ILD) over the PFET and NFET devices, and removing the gate masks of the PFET and NFET devices to form high-k metal gates (HKMGs) between the PFET and NFET epi growth regions.

In accordance with another embodiment, a method is provided for forming equal thickness gate spacers for a CMOS (complementary metal oxide semiconductor) device. The method includes forming a PFET device and an NFET device each including gate masks, forming PFET epi growth regions, forming NFET epi growth regions, depositing a nitride liner and an oxide over the PFET and NFET epi growth regions, the nitride liner and oxide extending up to the gate masks, and removing the gate masks to form HKMGs between the PFET and NFET epi growth regions.

In accordance with another embodiment, a semiconductor structure is provided for forming equal thickness gate spacers. The structure includes a PFET device, an NFET device, a dielectric island formed between the PFET and NFET devices, a PFET sidewall spacer formed on one side of the dielectric island, and an NFET sidewall spacer formed on the other side of the dielectric island, such that the NFET sidewall spacer has a width equal to the width of the PFET sidewall spacer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
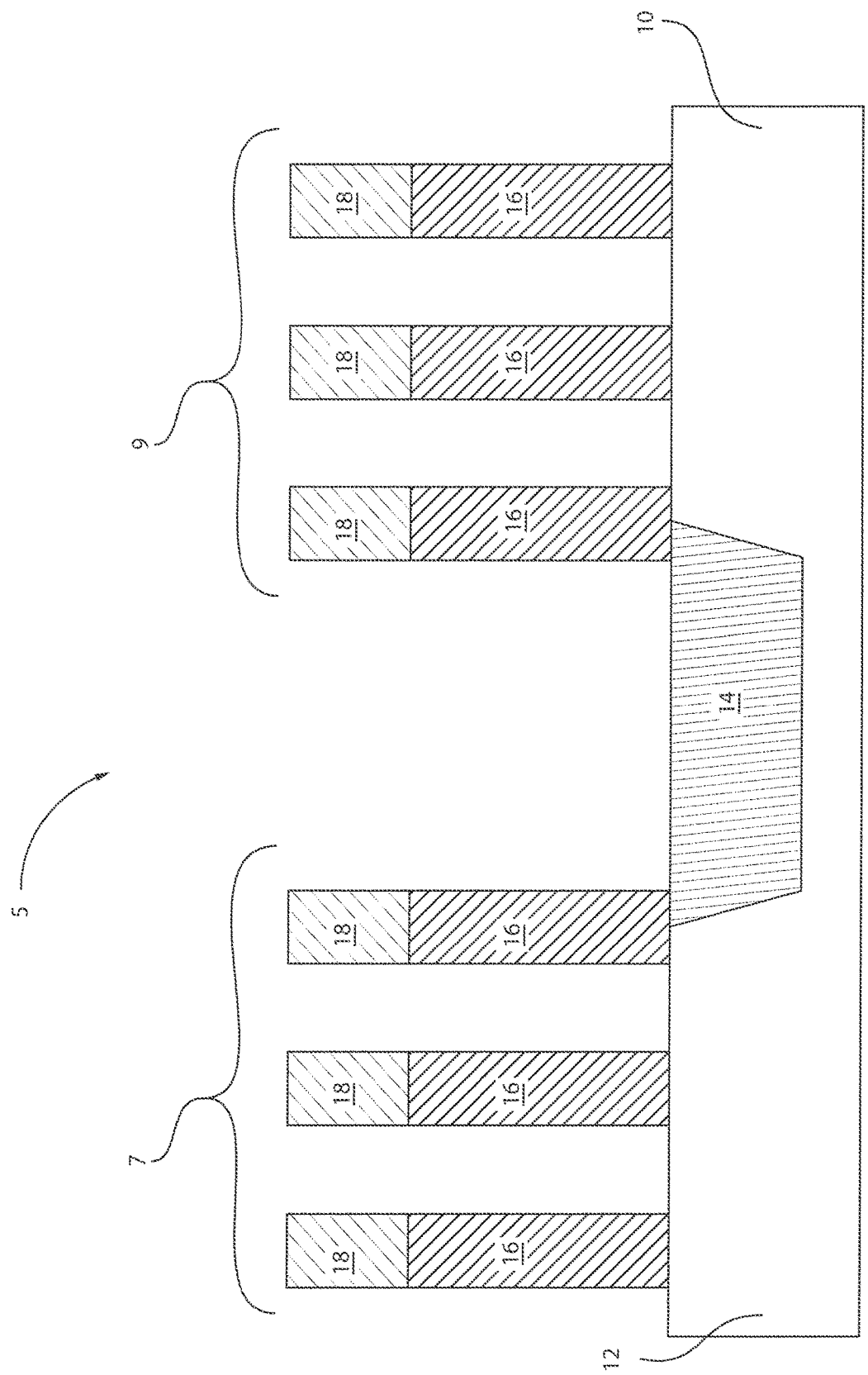
FIG. 1 is a cross-sectional view of a semiconductor structure including an NFET (n-type field effect transistor) device and a PFET (p-type field effect transistor) device, in accordance with an embodiment of the present invention.

In one or more embodiments, a method is provided for forming equal thickness gate spacers for PFET (p-type field effect transistor) and NFET (n-type field effect transistor) devices. The method includes depositing at least a first dielectric layer to pinch-off space between gates, recessing the first dielectric layer such that a first gate hard mask is exposed, depositing a first conformal atomic layer deposition (ALD) layer or depositing a first directed self-assembly (DSA) layer adjacent gate masks of the PFET and NFET devices, masking the NFET device and etching the first dielectric layer in a PFET region using the first ALD layer or the first DSA layer as a mask to form a PFET spacer, and forming PFET epi growth regions. The method further includes depositing a first nitride liner and a first inter-level dielectric (ILD) over the PFET and NFET devices, recessing the ILD and the nitride liner to reveal a second gate hard mask, depositing a second conformal ALD layer or depositing a second DSA layer adjacent the gate masks of the PFET and NFET devices, and masking the PFET device and etching the first dielectric layer in NFET region using the second ALD layer or the second DSA layer as a mask to form an NFET spacer. The method further includes forming NFET epi growth regions, depositing a second nitride liner and a second inter-level dielectric (ILD) over the PFET and NFET devices, and removing the gate masks of the PFET and NFET devices to form high-k metal gates (HKMGs) between the PFET and NFET epi growth regions.

In one or more embodiments, a method is provided for forming equal thickness gate spacers for a CMOS (complementary metal oxide semiconductor) device. The method includes forming a PFET device and an NFET device each including gate masks, forming PFET epi growth regions, forming NFET epi growth regions, depositing a nitride liner and an oxide over the PFET and NFET epi growth regions, the nitride liner and oxide extending up to the gate masks, and removing the gate masks to form HKMGs between the PFET and NFET epi growth regions.

In one or more embodiments, a semiconductor structure is provided for forming equal thickness gate spacers. The structure includes a PFET device, an NFET device, a dielectric island formed between the PFET and NFET devices, a PFET sidewall spacer formed on one side of the dielectric island, and an NFET sidewall spacer formed on the other side of the dielectric island, such that the NFET sidewall spacer has a width equal to the width of the PFET sidewall spacer.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

As used herein, the term "fin structure" refers to a semiconductor material, which can be employed as the body of a semiconductor device, in which a gate structure is positioned around the fin structure such that charge flows down the channel on the two sidewalls of the fin structure and optionally along the top surface of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor structure including an NFET (n-type field effect transistor) device and a PFET (p-type field effect transistor) device, in accordance with an embodiment of the present invention.

An exemplary semiconductor structure 5 according to an embodiment of the present invention includes semiconductor material portions 10, 12 provided on an insulator layer (not shown). A substrate (not shown) can be provided underneath the insulator layer to provide mechanical support to the insulator layer and the semiconductor material portions 10, 12. The substrate can be a semiconductor layer, an insulator layer, or a conductive material layer. The insulator layer includes an insulator material such as, but not limited to, silicon oxide ($SiO_2$). Additionally, the exemplary embodiments are not limited to silicon-on-insulator (SOI) structures. The exemplary embodiments can pertain to bulk complementary metal oxide semiconductors (CMOS), as well as to planar transistors, FETs, FinFETs, nanowires, etc. One skilled in the art may contemplate applying the present exemplary embodiments to various semiconductor technologies without any limitation.

In one or more embodiments, the structure 5 can be formed on a substrate (not shown). The substrate can be a semiconductor or an insulator with an active surface semiconductor layer. The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate can also have other layers forming the substrate, including high-k oxides and/or nitrides. In one or more embodiments, the substrate can be a silicon wafer. In an embodiment, the substrate is a single crystal silicon wafer.

The semiconductor material portions 10, 12 can be formed by providing a semiconductor-on-insulator layer including, from bottom to top, the substrate, the insulator layer, and a top semiconductor layer, and subsequently patterning the top semiconductor layer. The top semiconductor layer can be patterned, for example, by application and lithographic patterning of a photoresist layer and subsequent pattern transfer into the top semiconductor layer employing an anisotropic etch. The photoresist layer can be removed, for example, by ashing.

At least one first semiconductor material portion 10 can be formed in a first device region 9, and at least one second semiconductor material portion 12 can be formed in a second device region 7. In one example embodiment, the at least one first semiconductor material portion 10 can be at least one first semiconductor fin, and the at least one second semiconductor material portion 12 can be at least one second semiconductor fin. However, one skilled in the art may contemplate the substrate or the channel of the device to be any type of substrate, such as, but not limited to, SOI, bulk CMOS, III-V materials, etc. Moreover, the semiconductor device can be any type of device, such as, but not limited to planar FETs, FinFETs, nanowires, etc.

The semiconductor material portions 10, 12 include at least one semiconductor material, which can be a Group IV semiconductor material, a compound semiconductor material, and/or an organic semiconductor material. Further, the at least one semiconductor material can be single crystalline, polycrystalline, or amorphous. In one embodiment, the semiconductor material portions 10, 12 include a single crystalline semiconductor material. The height of each semiconductor material portions 10, 12 can be in a range from 30 nm to 200 nm, although lesser and greater heights can also be employed. The width of each semiconductor material portion 10, 12 can be in a range from 10 nm to 100 nm, although lesser and greater widths can also be employed.

A shallow trench isolation (STI) region 14 can be formed between the PFET 10 and the NFET 12. The STI region 14 can be formed by etching a trench in the substrate utilizing a conventional dry etching process such as RIE or plasma etching. The trenches can optionally be lined with a conventional liner material, e.g., silicon nitride or silicon oxynitride, and then CVD or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure.

A plurality of dummy gates 16 can be formed over the PFET 10 and the NFET 12.

The block mask 18 can comprise soft and/or hard mask materials and can be formed using deposition, photolithography and etching. In one embodiment, the block mask 18 is a hard mask composed of a nitride-containing material, such as silicon nitride (SiN). It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting at least one portion of the dummy gate. A patterned photoresist can be produced by applying a blanket photoresist layer to the surface of the dummy gate, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

In one example embodiment, the block mask is aluminum oxide ($Al_2O_3$).

Figure 2:
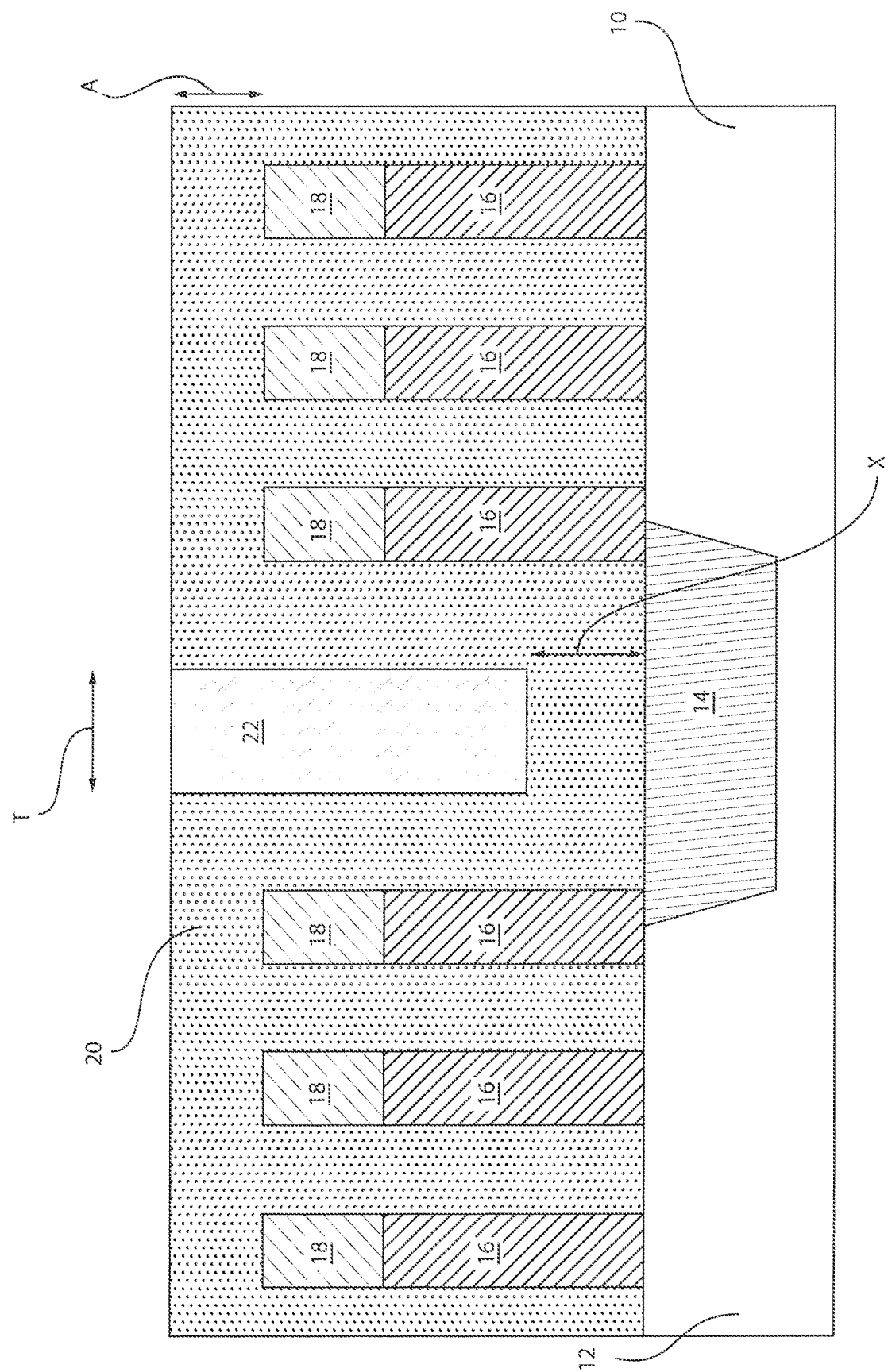
FIG. 2 is a cross-sectional view of the semiconductor structure of FIG. 1 where silicon nitride and oxide deposition takes place, in accordance with an embodiment of the present invention.

FIG. 2 is a cross-sectional view of the semiconductor structure of FIG. 1 where silicon nitride and oxide deposition takes place, in accordance with an embodiment of the present invention.

In various embodiments, a nitride layer 20 is formed over the first and second regions 7, 9 of the structure. Additionally, an oxide layer or region 22 is deposited between the PFET 10 and the NFET 12. The nitride layer 20 can be formed by, e.g., a conformal deposition process, e.g., ALD. Since the gate pitch is so small, the spaces between gates in region 7 and 9 are pinched-off by ALD SiN fill. The nitride layer 20 can be, e.g., a nitride film. In an embodiment, the nitride layer 20 can be an oxide, for example, silicon oxide (SiO), a nitride, for example, a silicon nitride (SiN), or an oxynitride, for example, silicon oxynitride (SiON). In an embodiment, the nitride layer 20 can be, e.g., SiOCN, SiBCN, or similar film types. The nitride layer 20 can also be referred to as a non-conducting dielectric layer. The nitride layer 20 can extend a distance "A" above the top surface of the dummy gates 16.

The thickness of the oxide layer 22 can be designated as "T." The oxide layer 22 can be aligned with the STI region 14. The oxide layer 22 does not contact the STI region 14. The oxide layer 22 is separated from the STI region 14 by a distance "X." The oxide layer 22 separates the dummy gates 16 of the PFET 10 from the dummy gates 16 of the NFET 12. The thickness of the oxide layer 22 can be greater than the thickness of the dummy gates 16. The top surface of the oxide layer 22 is flush with the top surface of the nitride layer 20.

Figure 3:
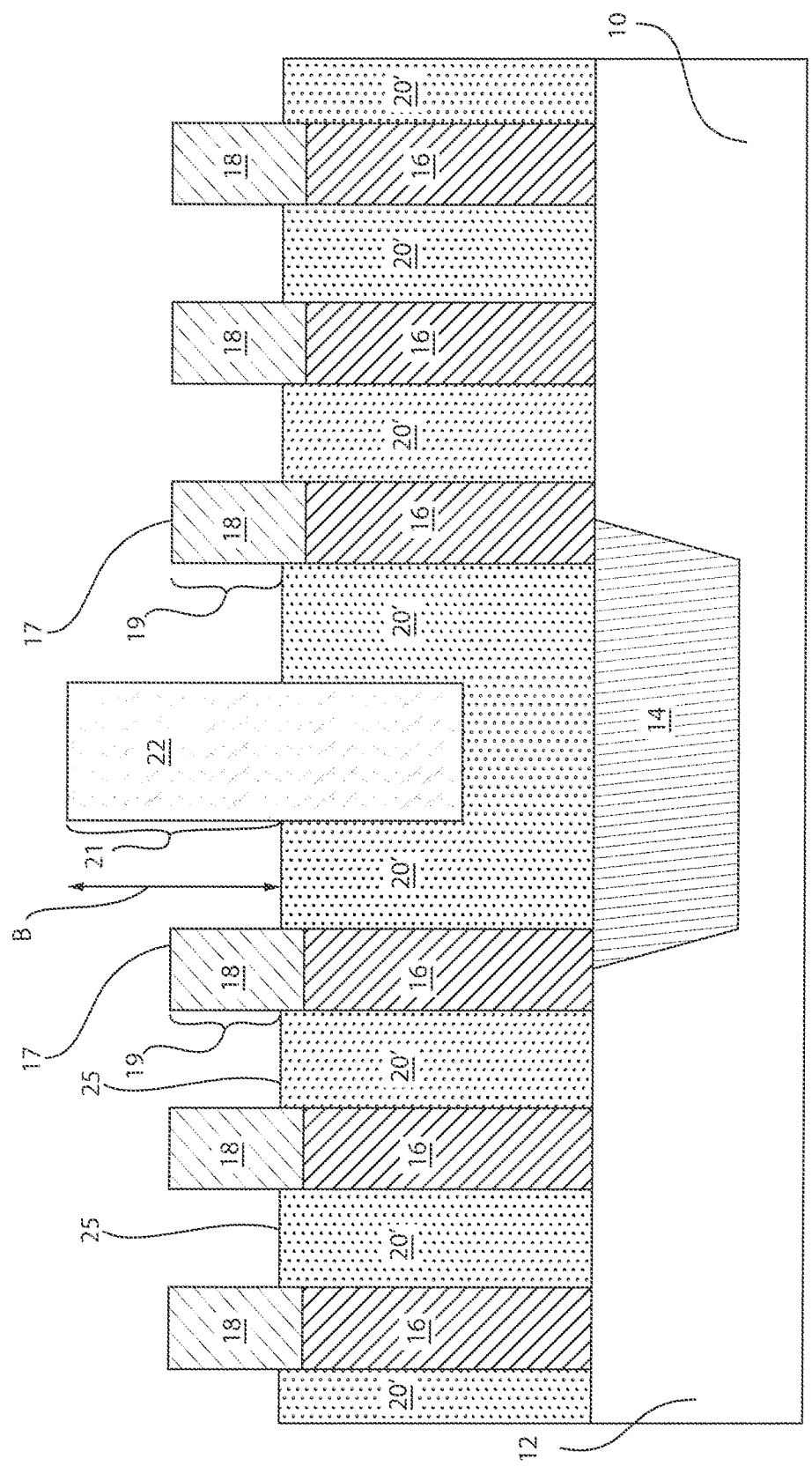
FIG. 3 is a cross-sectional view of the semiconductor structure of FIG. 2 where the silicon nitride is recessed, in accordance with an embodiment of the present invention.

FIG. 3 is a cross-sectional view of the semiconductor structure of FIG. 2 where the silicon nitride is recessed, in accordance with an embodiment of the present invention.

In various embodiments, the nitride layer 20 is etched to form nitride layer regions 20' between the dummy gates 16. The etching of the nitride layer 20 results in the exposure of a top portion or section of the block mask 18. For instance, the top surface 17 of the block mask 18 is exposed. Additionally, a top section 19 of the block mask 18 is exposed. The nitride layer 20 is etched by a distance "B" extending from a top surface of the oxide layer 22 to a top surface 25 of the remaining nitride layer regions 20'. Moreover, a sidewall surface 21 of the oxide layer 22 is exposed. The sidewall surface 21 is defined by the distance "B."

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 4:
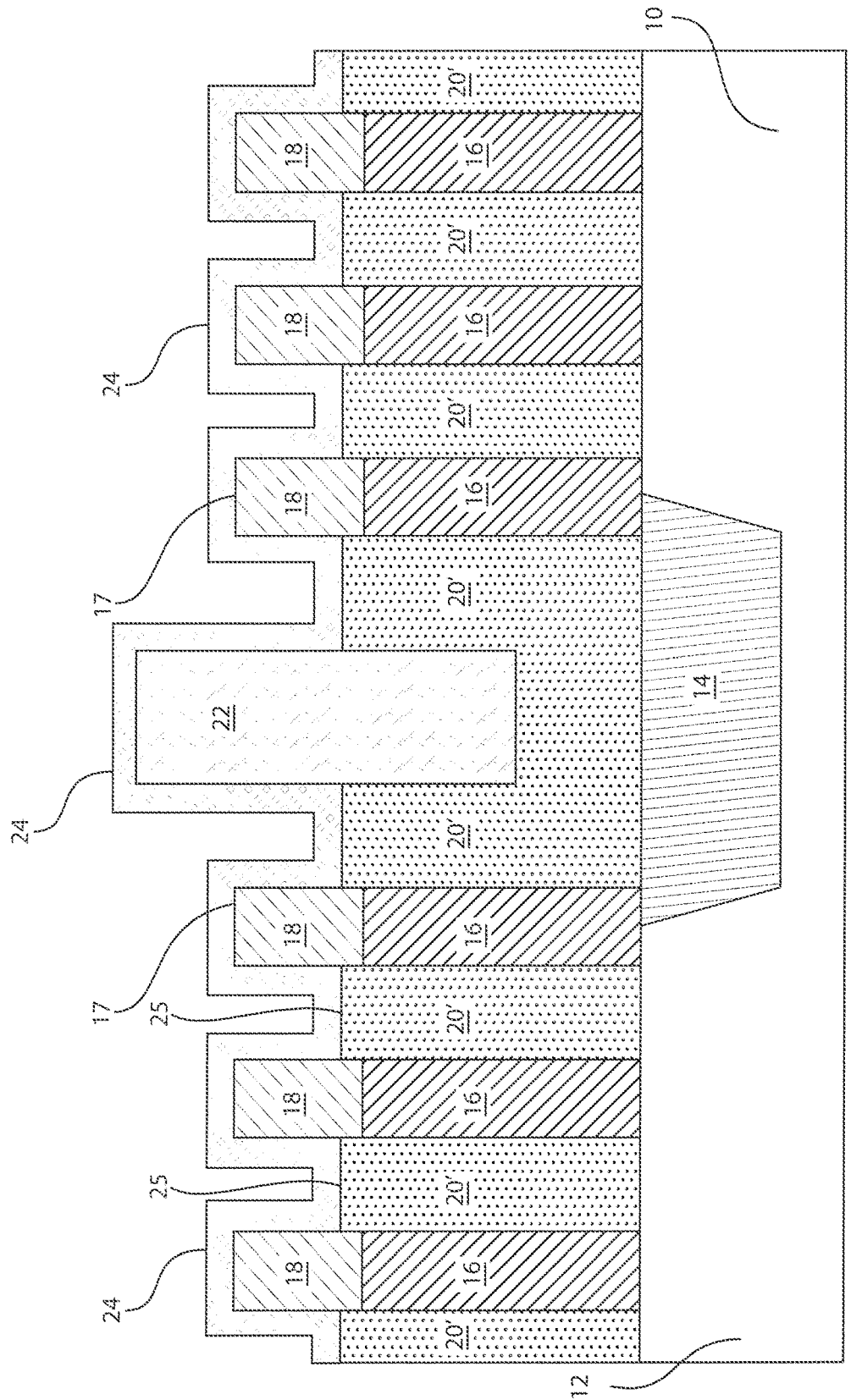
FIG. 4 is a cross-sectional view of the semiconductor structure of FIG. 3 where an oxide layer is deposited, in accordance with an embodiment of the present invention.

FIG. 4 is a cross-sectional view of the semiconductor structure of FIG. 3 where an oxide layer is deposited, in accordance with an embodiment of the present invention.

In various embodiments, an oxide layer 24 is deposited. The oxide layer 24 would cover the exposed surfaces 17, 19 of the block mask 18 of the dummy gates 16, as well as the sidewall surfaces 21 of the oxide layer 22.

There are two ways to define the spacer thickness. The first way is to use a ALD oxide layer to define it, which is shown in FIG. 4. The second way is to use direct self-assembly to define, it which is shown in FIG. 5.

Figure 5:
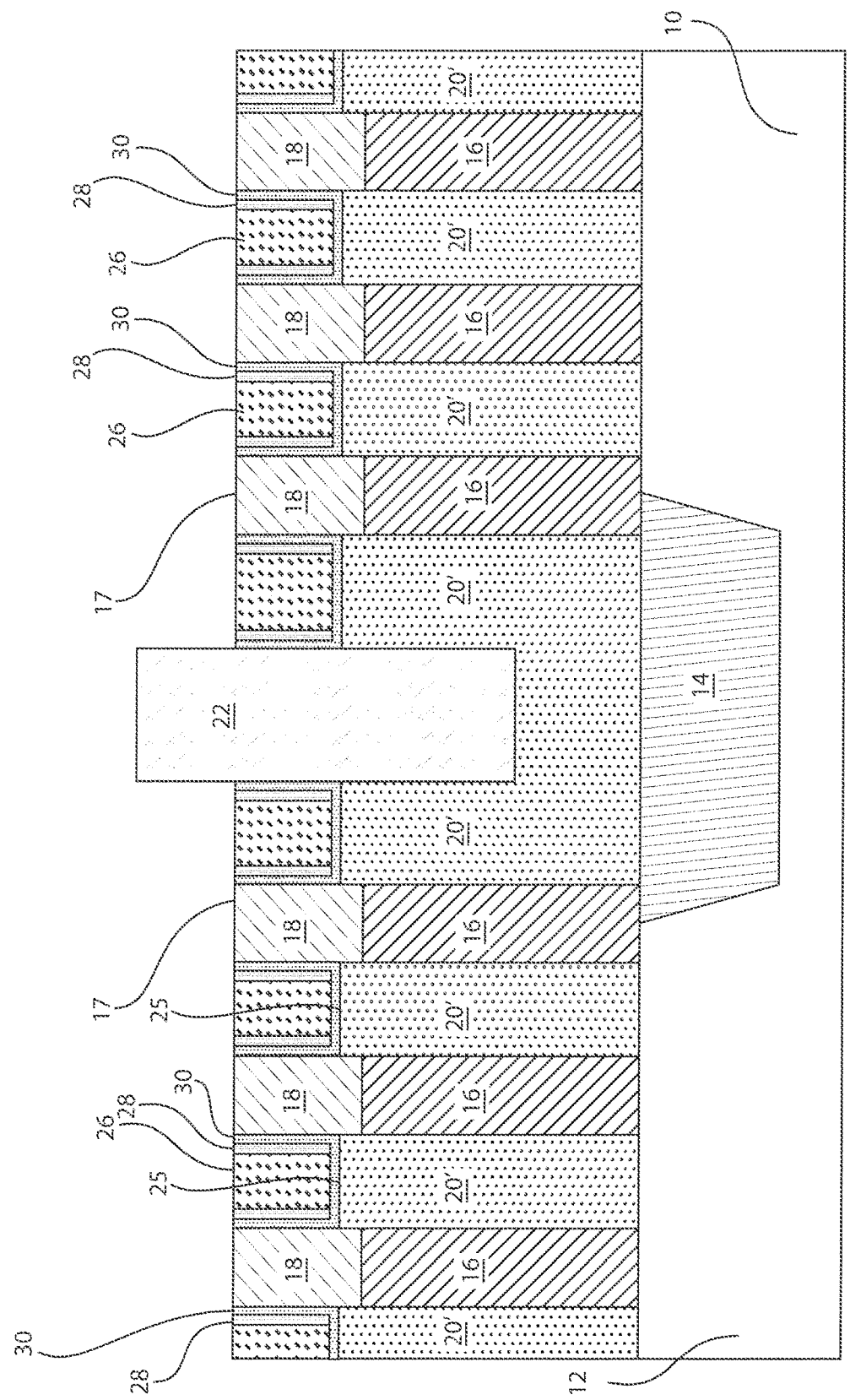
FIG. 5 is a cross-sectional view of the semiconductor device of FIG. 3 where a polystyrene (PS) layer and a block copolymer (BCP) are formed, in accordance with an embodiment of the present invention.

Once spacer thickness is defined by one of the techniques in either FIG. 4 or FIG. 5, the remaining process flow is the same.

Thus, FIG. 4 illustrates the direct self-assembly approach for the following figures. In other words, FIGS. 4 and 5 are two parallel choices that can be selected. If one selects FIG. 4, then FIG. 5 can be skipped and the process can jump to FIG. 6. In the alternative, if FIG. 5 is selected, FIG. 4 can be skipped.

FIG. 5 is a cross-sectional view of the semiconductor device of FIG. 3 where a polystyrene (PS) layer and a block copolymer (BCP) are formed, in accordance with an embodiment of the present invention.

In various embodiments, a polymethyl methacrylate (PMMA) 26 and a polystyrene (PS) 28 domain of BCP crosslinked with polystyrene brush materials 30 are formed over the remaining nitride layer regions 20'. The PS brush material layer 30 is formed directly adjacent a sidewall surface of the block mask 18 by a spin coating process. The BCP is applied over the open area 20 and subsequently annealed to form discrete segregated polymethyl methacrylate (PMMA) domains 26 and polystyrene domains 28, which crosslinked to the PS brush material 26. The PMMA 26 and PS 28 domains are planarized such that top surface of such layers is flush with the top surface 17 of the block mask 18.

For PS-PMMA based block polymer, after phase separation, it is separated to the PS regime (which will connect to the PS brush on the sidewall) and to the PMMA regime in the center. Thus, 26 represents the BCP's PMMA regime, whereas 28 represents the BCP's PS regime.

Block copolymer (BCP) patterning has attracted attention as a possible solution to the problem of creating patterns with smaller dimensions. Under the right conditions, the blocks of such copolymers phase separate into micro domains (also known as "micro phase-separated domains" or "domains") to reduce the total free energy, and in the process, nanoscale features of dissimilar chemical composition are formed. The ability of block copolymers to form such features recommends their use in nano-patterning, and to the extent that features with smaller dimensions can be formed, this should enable the construction of features which would otherwise be difficult to print using conventional lithography. However, without any guidance from the substrate, the micro domains in a self-assembled BCP thin film are typically not spatially registered or aligned.

To address this issue of spatial registration and alignment, directed self-assembly (DSA) has been used. This is a method that combines aspects of self-assembly with a lithographically defined substrate to control the spatial arrangement of certain self-assembled BCP domains. One DSA technique is graphoepitaxy, in which self-assembly is guided by topographical features of lithographically pre-patterned substrates. BCP graphoepitaxy provides sub-lithographic, self-assembled features having a smaller characteristic dimension than that of the pre-pattern itself.

A copolymer as used herein is a polymer derived from more than one species of monomer. A block copolymer as used herein is a copolymer that comprises more than one species of monomer, wherein the monomers are present in blocks. Each block of the monomer comprises repeating sequences of the monomer. A formula (1) representative of a block copolymer is shown below:

$$-(A)_a\text{-}(B)_b\text{-}(C)_c\text{-}(D)_d \ldots -(Z)_z- \qquad (1)$$

wherein A, B, C, D, through Z represent monomer units and the subscripts "a", "b", "c", "d" through "z", represent the number of repeating units of A, B, C, D through Z, respectively. The above-referenced representative formula is not meant to limit the structure of the block copolymer used in the present invention. The aforementioned monomers of the copolymer can be used individually and in combinations thereof in accordance with the methods of the present invention.

The PS domain 28 of BCP that might be suitable for use in the present methods include diblock or triblock copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth) acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), or a combination comprising at least one of the foregoing block copolymers.

Figure 6:
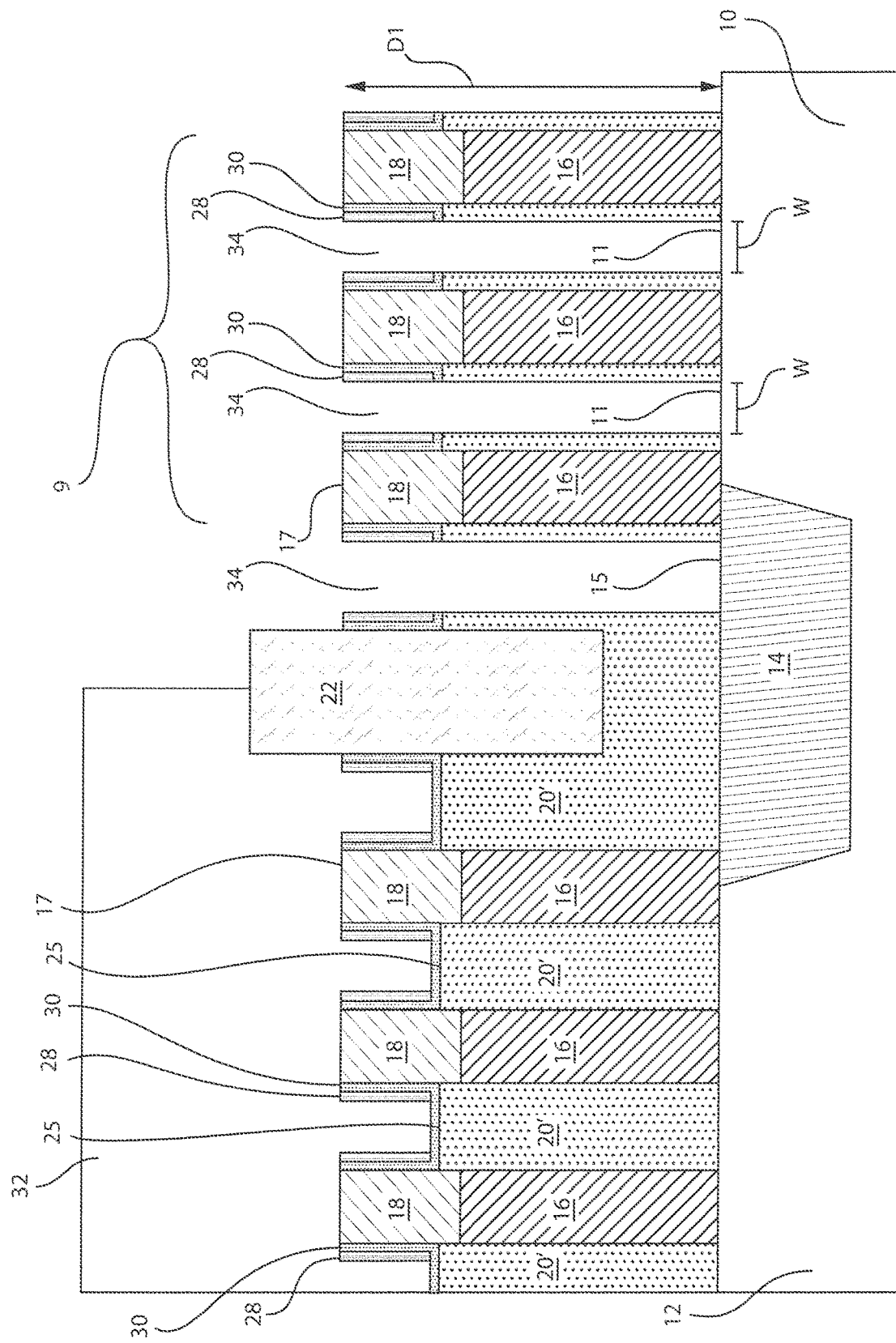
FIG. 6 is a cross-sectional view of the semiconductor device of FIG. 5 where an organic planarization layer (OPL) is deposited over the NFET device and portions of the PFET device are etched, in accordance with an embodiment of the present invention.

FIG. 6 is a cross-sectional view of the semiconductor device of FIG. 5 where an organic planarization layer (OPL)

is deposited over the NFET device and portions of the PFET device are etched, in accordance with an embodiment of the present invention.

In various embodiments, the PMMA domain 26 is removed entirely and an organic planarization layer (OPL) 32 is applied over the entire device/structure. The OPL 32 is then removed from the PFET device 10 by a lithography and etch process. The remaining nitride layer regions 20' of the PFET portion 9 are then etched away, by, e.g., RIE to form a PFET spacer. The removal of the nitride layer regions 20' of the PFET portion 9 result in the exposure of the top surface 15 of the STI region 14 and the exposure of top portions 11 of the first semiconductor material portion 10 (PFET device). As a result, recesses 34 are created between the dummy gates 16 of the PFET portion 9. It is noted that a small amount of the nitride layer regions 20' of the PFET portion 9 remain intact against the sidewalls of the dummy gates 16. The recesses 34 can define a distance "D1" from the top surface 11 of the PFET device to the top surface 17 of the block mask 18. The recesses 34 can further define a spacer width "W" between the dummy gates 16. The spacer width "W" can be defined by ALD (FIG. 4) or by DSA (FIG. 5). The spacer width "W" is defined as the space between the S/D epi and the dummy a-Si gate.

OPL is spin on process. After OPL 32 is coated, usually anti-reflective coating material (such as SiARC, TiARC, etc.), is further coated thereon, and then followed by a photo resist deposition. Then a lithography process is applied such that NFET photo resist is still there while PFET OPL is exposed and followed by an OPL RIE process to remove OPL from PFET.

The thickness of the OPL 32 can vary so long as its thickness is greater than the total thickness of each gate line and of the plurality of gate lines (not shown). In one embodiment, the OPL 32 has a thickness from 50 nm to 500 nm. In another embodiment, the OPL 32 has a thickness from 150 nm to 300 nm.

Figure 7:
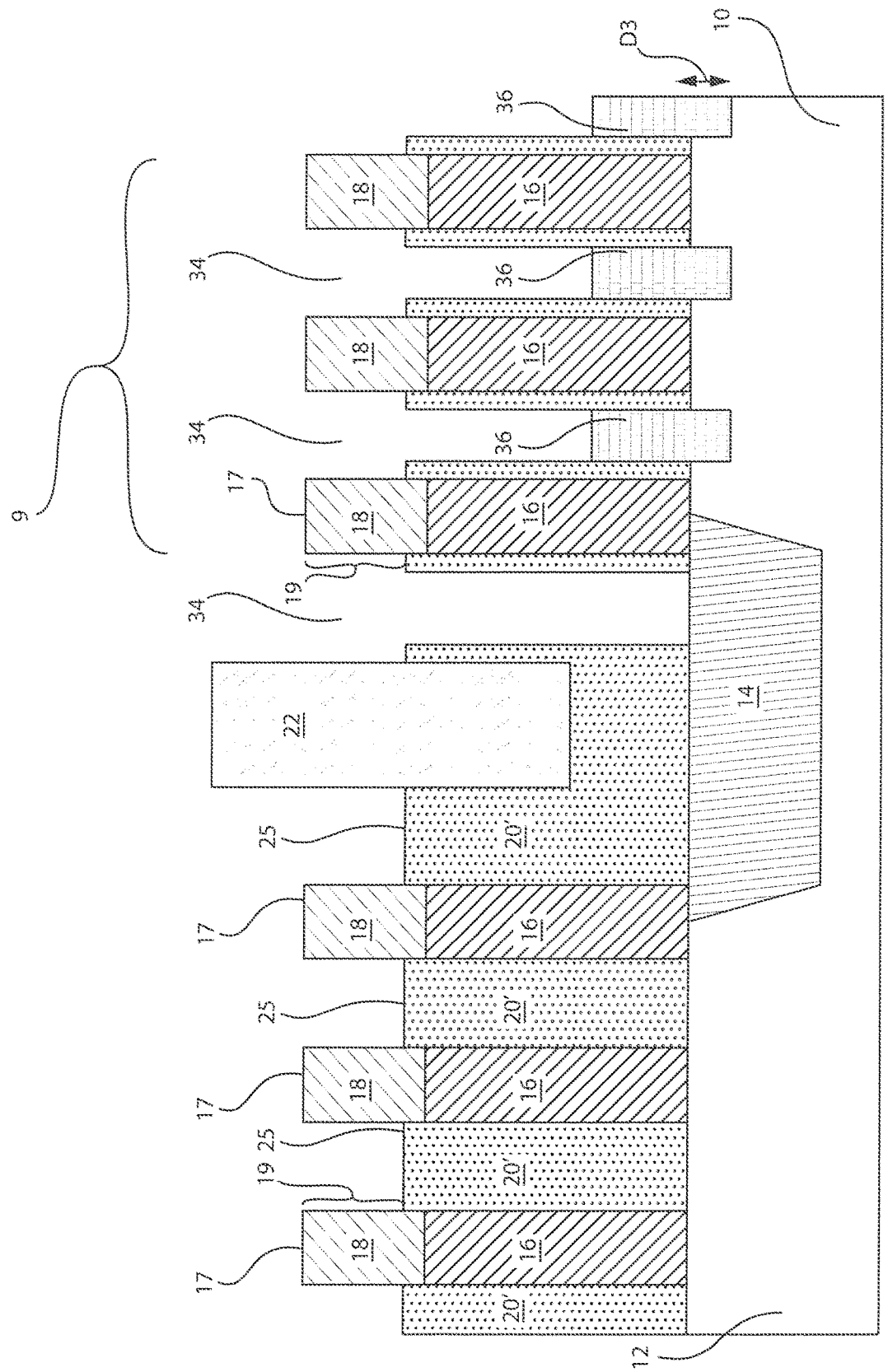
FIG. 7 is a cross-sectional view of the semiconductor device of FIG. 6 where PFET epi growth takes place, in accordance with an embodiment of the present invention.

FIG. 7 is a cross-sectional view of the semiconductor device of FIG. 6 where the OPL is stripped, the DSA layers are removed, and PFET epi growth takes place, in accordance with an embodiment of the present invention.

In various embodiments, the OPL 32 is stripped and then the DSA layers 28, 30 are removed. The PFET epi growth 36 then takes place. The removal of the DSA layers 28, 30 results in the exposure of a sidewalls 19 of the block mask 18. The PFET epi growth 36 takes place between the dummy gates 16 and, specifically, adjacent the small amount of the nitride layer regions 20' of the PFET portion 9 remaining intact against the sidewalls of the dummy gates 16. The PFET epi growth 36 extends a distance "D3" into the first semiconductor material portion 10 (PFET device).

In various embodiments, the in-situ doped source/drain 36 is advantageously deposited or formed via epitaxial growth. Depending on how the epitaxial growth develops, it can be necessary to anisotropically etch the epitaxial growth, in order to result in a top surface of the source/drain region 36 that is suitable for subsequent processing.

The doped region 36 can be formed above the PFET portion 16. The dopant can be provided to the doped region(s) 36 (i.e., source/drain region(s)) by ion implantation, and source/drains formed by annealing the doped region(s) 36. In various embodiments, the doped region 36 can be n-doped or p-doped.

In various embodiments, the bottom source can be doped in-situ or ex-situ, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain region 36 can include forming an in situ doped epitaxial semiconductor material on the source and drain region portions of the first semiconductor material portion 10 (PFET device). The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain region 36 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain region 36.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain region 36 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source can include diborane ($B_2H_6$). In some embodiments, the epitaxial deposition process for forming the epitaxial semiconductor material for the source and drain regions can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 8:
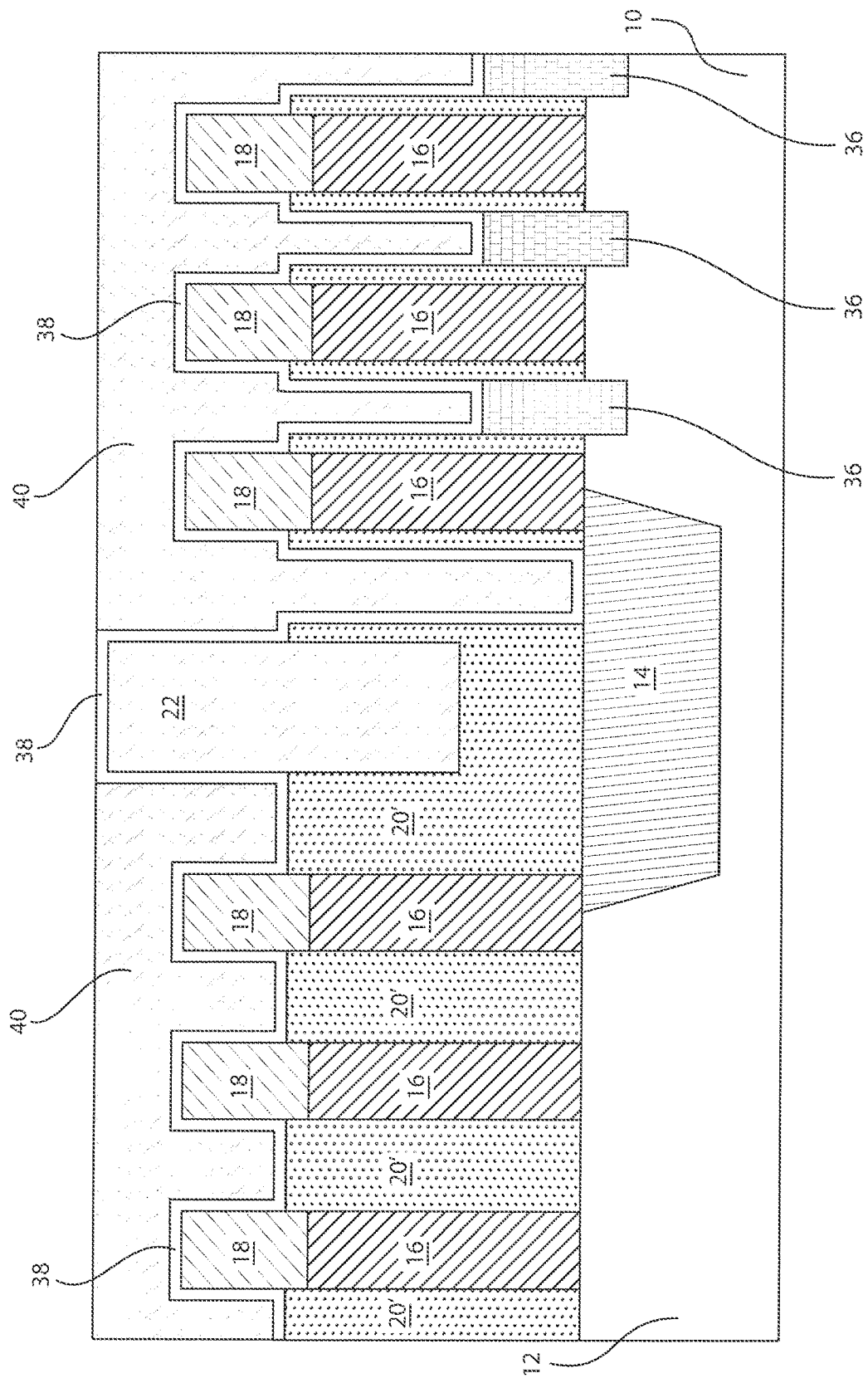
FIG. 8 is a cross-sectional view of the semiconductor device of FIG. 7 where a nitride liner and an oxide is deposited, in accordance with an embodiment of the present invention.

FIG. 8 is a cross-sectional view of the semiconductor device of FIG. 7 where a thin nitride liner is deposited followed by an oxide is deposited, and followed by CMP, in accordance with an embodiment of the present invention.

In various embodiments, a nitride liner 38 is deposited and then an oxide 40 deposition takes place. The oxide 40 can be, e.g., an inter-level dielectric (ILD). The ILD oxide 40 is planarized. The ILD oxide 40 fills the remaining gap or recess between the dummy gates 16 of the PFET portion 9.

In various embodiments, the height of the ILD oxide fill 40 can be reduced by chemical-mechanical polishing (CMP) and/or etching. Therefore, the planarization process can be provided by CMP. Other planarization process can include grinding and polishing. "Planarization" is a material removal process that employs at least mechanical forces, such as frictional media, to produce a substantially two-dimensional surface. A planarization process can include chemical mechanical polishing (CMP) or grinding. Chemical mechanical polishing (CMP) is a material removal process that uses both chemical reactions and mechanical forces to remove material and planarize a surface.

In one or more embodiments, the ILD oxide 40 can have a height in the range of about 20 nm to about 200 nm.

The ILD 40 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 40 include any of the aforementioned materials in porous form, or in a form that changes during processing to or from being porous and/or permeable to being non-porous and/or non-permeable.

In various embodiments, the top sections formed over the structure are removed by, e.g., CMP. Therefore, the planarization process can be provided by CMP. Other planarization process can include grinding and polishing.

Figure 9:
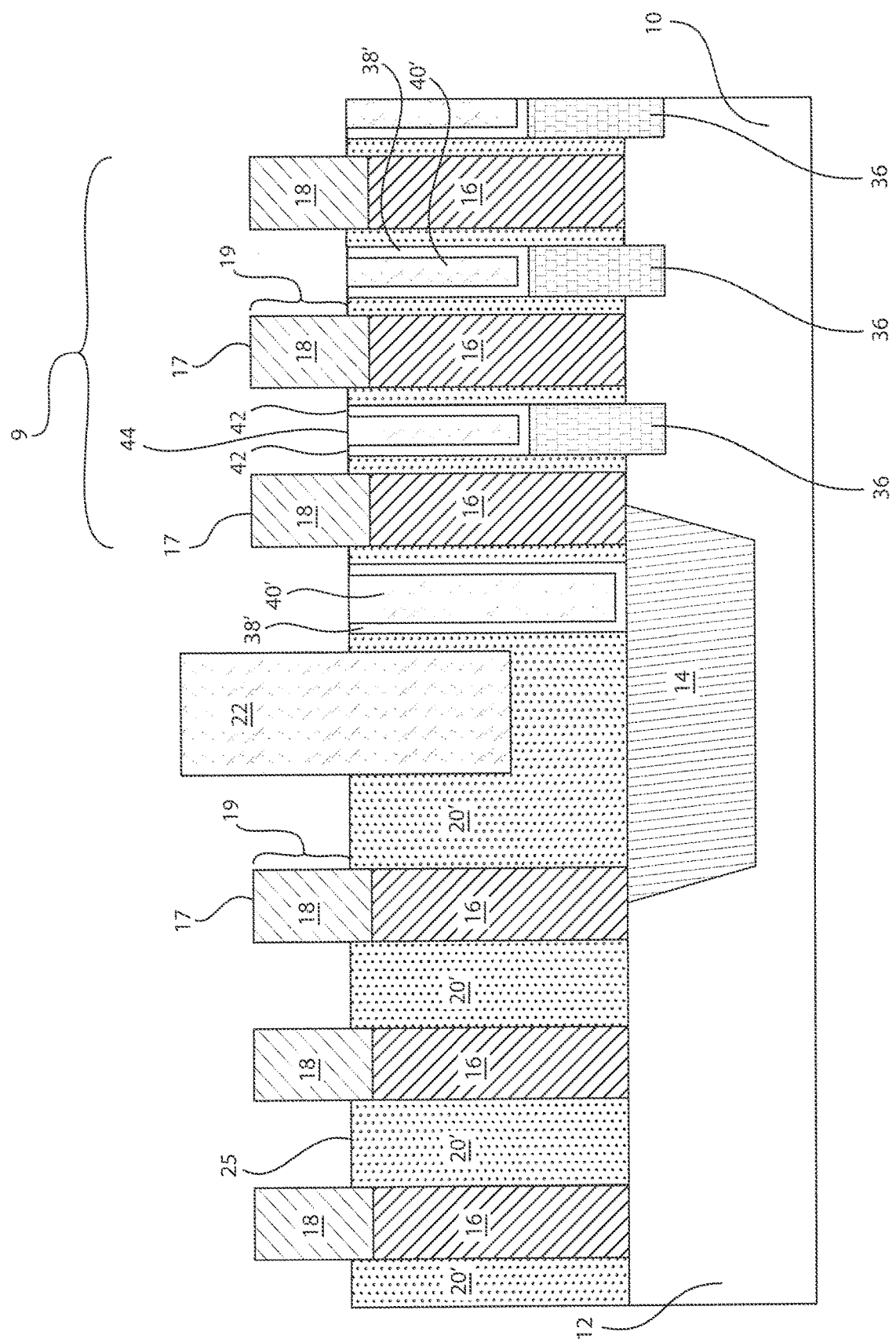
FIG. 9 is a cross-sectional view of the semiconductor device of FIG. 8 where the oxide and nitride liner are selectively etched such that oxide regions are formed between the sections of the PFET device, in accordance with an embodiment of the present invention.

FIG. 9 is a cross-sectional view of the semiconductor device of FIG. 8 where the oxide and nitride liner are selectively etched such that oxide regions are formed between the sections of the PFET device, in accordance with an embodiment of the present invention.

In various embodiments, a portion of the oxide 40 and the nitride liner 38 are selectively removed to expose a top surface 17 of the block masks 18, as well as the sidewall surfaces 19 of the block masks 18. Additionally, the top surface 25 of the remaining nitride layer regions 20' are exposed. In the PFET portion 9, the top surface 42 of the nitride liner 38' and the top surface 44 of the oxide 40' are exposed. The selective removal results in nitride liner 38' and oxide 40' remaining between the dummy gates 16. The thickness of the oxide 40' is greater than the thickness of the nitride liner 38'. The oxide 40' does not contact the remaining nitride layer regions 20' formed adjacent the dummy gates 16.

Figure 10:
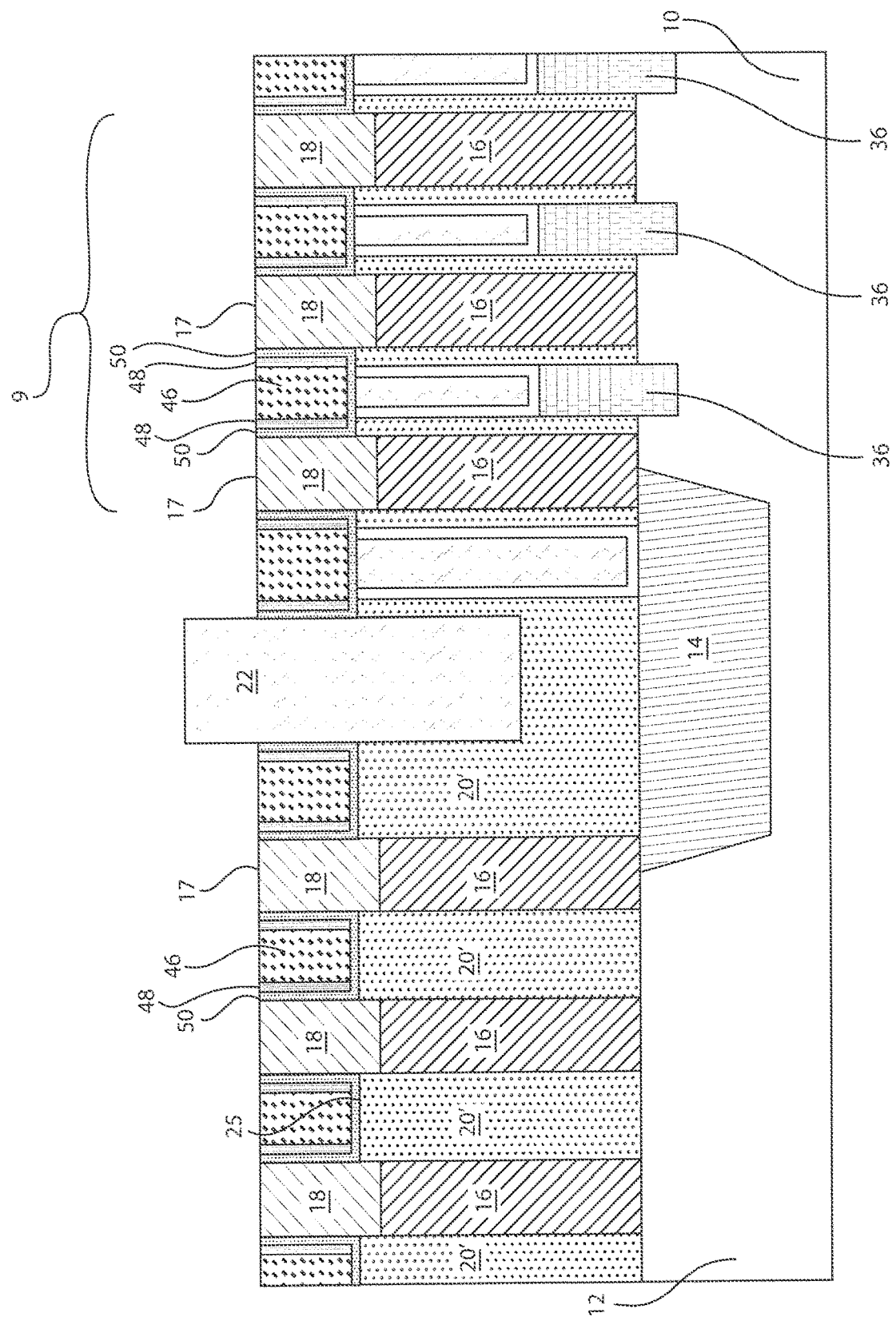
FIG. 10 is a cross-sectional view of the semiconductor device of FIG. 9 where a PS layer and a block copolymer (BCP) are formed, in accordance with an embodiment of the present invention.

FIG. 10 is a cross-sectional view of the semiconductor device of FIG. 9 where a PS layer and a block copolymer (BCP) (DSA layers) are formed, in accordance with an embodiment of the present invention.

Once again, there are two ways to define the spacer thickness. The first way is to use a ALD oxide layer to define it and the second way is to use direct self-assembly to define it. Once spacer thickness is defined by one of the techniques, the remaining process flow is the same.

Thus, FIG. 4 above illustrates the direct self-assembly approach for the following figures. In other words, FIGS. 4 and 10 are two parallel choices that can be selected. If one selects FIG. 4, then FIGS. 5, 10 can be skipped and the process can jump to FIG. 11. In the alternative, if FIGS. 5, 10 is selected, FIG. 4 can be skipped.

In various embodiments, a polymethyl methacrylate (PMMA) 46, a block copolymer (BCP) 48, and a polystyrene (PS) layer 50 are formed over the remaining nitride layer regions 20' of the NFET portion 7, as well as over the nitride liner 38' and oxide 40' (of the PFET portion 9) remaining between the dummy gates 16. The PMMA 46 is formed between the BCP 48. The PMMA 46 and the BCP 48 are formed within the PS layer 50. Stated differently, the BCP 48 is formed directly adjacent the PMMA 46 and the PS layer 50. The PS layer 50 is formed directly adjacent a sidewall surface of the block mask 18. The PMMA 46, the BCP 48, and the PS layer 50 are planarized such that top surface of such layers is flush with the top surface 17 of the block mask 18.

Figure 11:
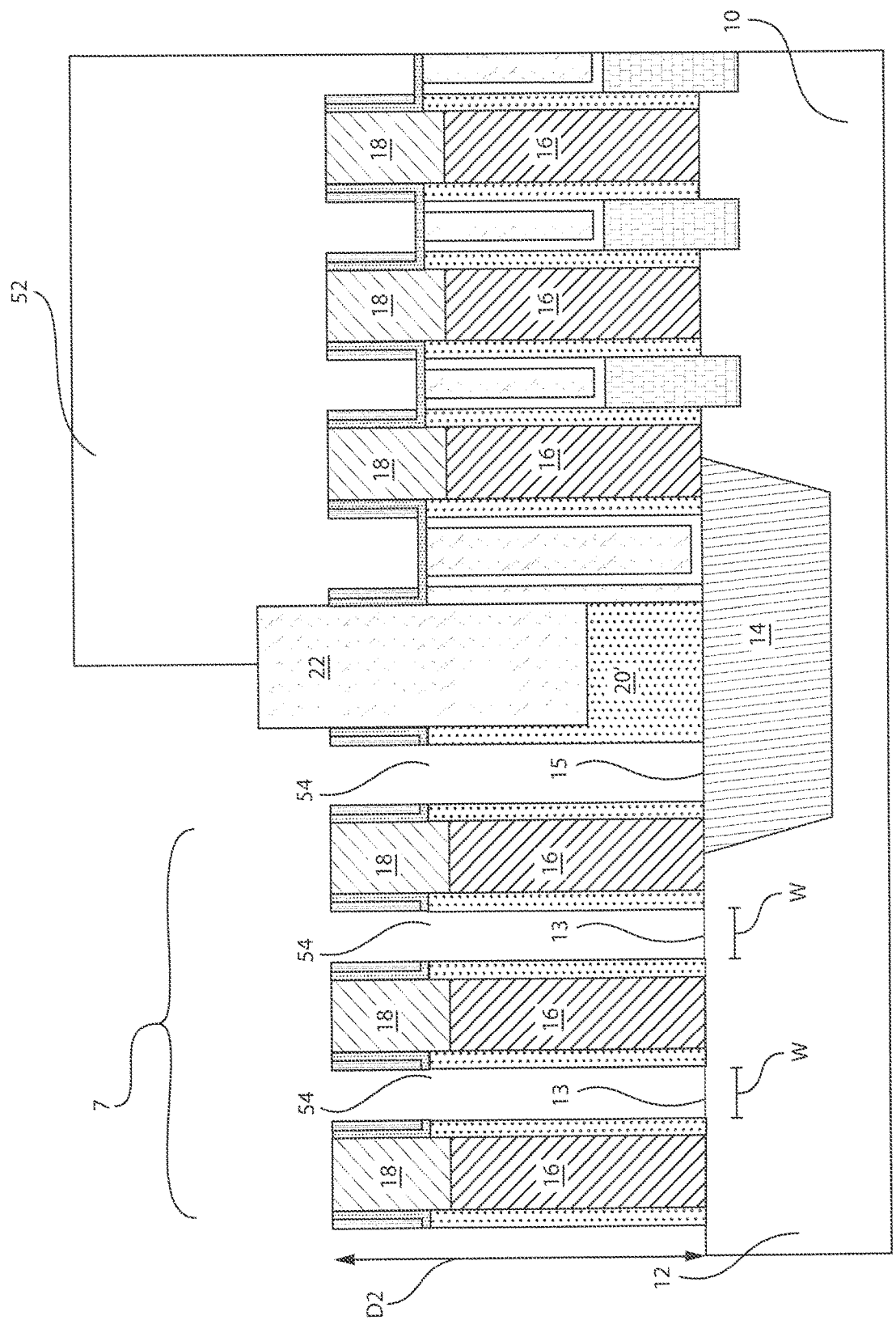
FIG. 11 is a cross-sectional view of the semiconductor device of FIG. 10 where an organic planarization layer (OPL) is deposited over the PFET device and portions of the NFET device are etched, in accordance with an embodiment of the present invention.

FIG. 11 is a cross-sectional view of the semiconductor device of FIG. 10 where an organic planarization layer (OPL) is deposited over the PFET device and portions of the NFET device are etched, in accordance with an embodiment of the present invention.

In various embodiments, the PMMA 46 is removed entirely and an organic planarization layer (OPL) 52 is applied over the entire device/structure. The OPL 32 is then removed from the NFET device 12 by a lithography and etch process. The remaining nitride layer regions 20' of the NFET portion 7 are then etched away, by, e.g., RIE to form an NFET spacer. The removal of the nitride layer regions 20' of the NFET portion 7 result in the exposure of the top surface 15 of the STI region 14 and the exposure of top portions 13 of the second semiconductor material portion 12 (NFET device). As a result, recesses 54 are created between the dummy gates 16 (of the NFET portion 7). It is noted that a small amount of the nitride layer regions 20' of the NFET portion 7 remain intact against the sidewalls of the dummy gates 16. The recesses 54 can define a distance "D2" from the top surface 13 of the NFET device to the top surface 17 of the block mask 18. The recesses 54 can further define a spacer width "W" between the dummy gates 16. The spacer width "W" can be defined by ALD (FIG. 4) or by DSA (FIGS. 5, 10). The spacer width "W" is defined as the space between the S/D epi and the dummy a-Si gate. The NFET spacer width is equal to the PFET spacer width, thus the common designation "W."

OPL is spin-on coated. After OPL 32 is coated, usually anti-reflective coating material (such as SiARC, TiARC, etc.), is further coated thereon, and then followed by a photo resist deposition. Then a lithography process is applied such that PFET photo resist is still there while NFET OPL is exposed and followed by an OPL RIE process to remove OPL from NFET.

Figure 12:
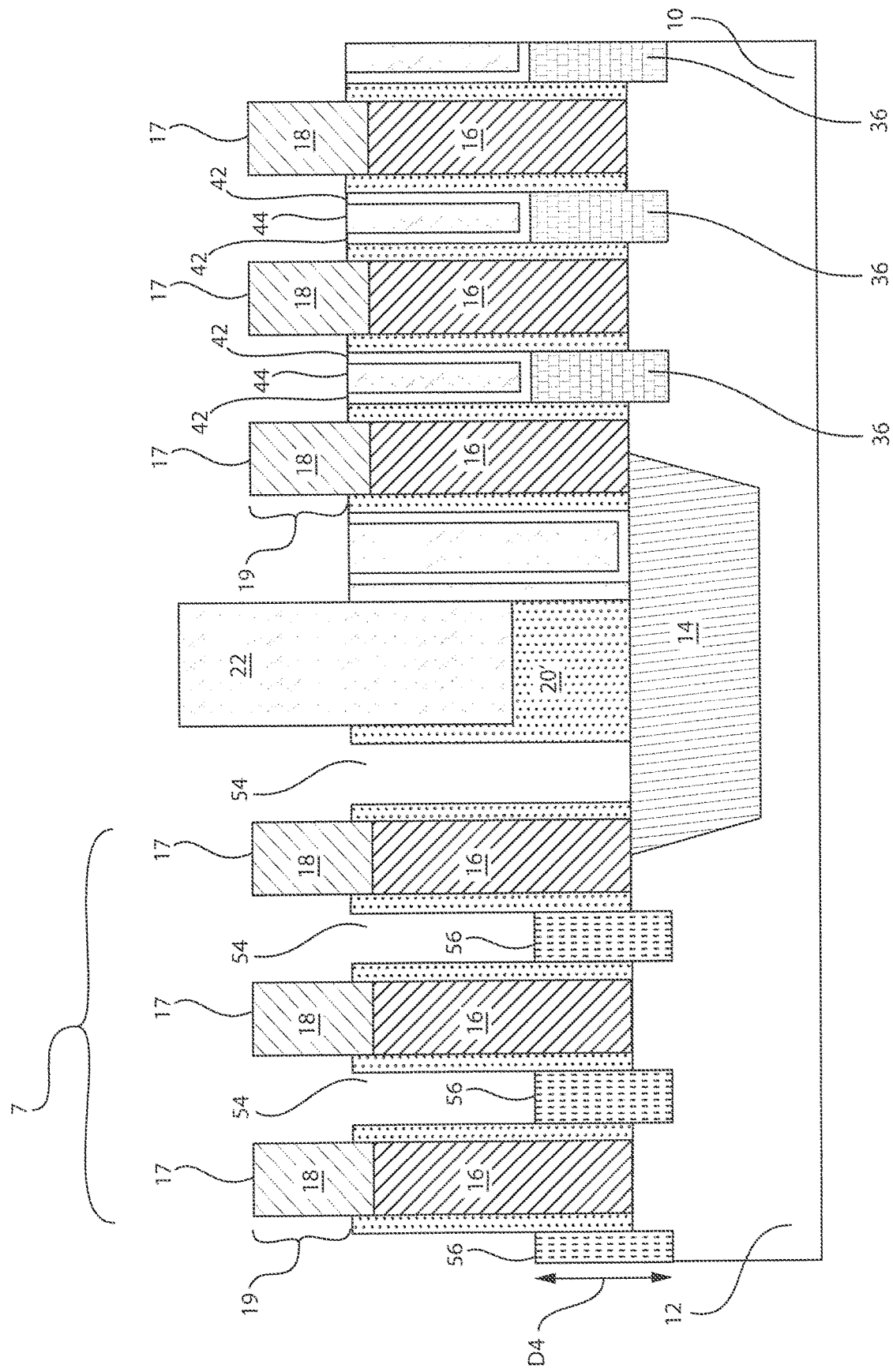
FIG. 12 is a cross-sectional view of the semiconductor device of FIG. 11 where NFET epi growth takes place, in accordance with an embodiment of the present invention.

FIG. 12 is a cross-sectional view of the semiconductor device of FIG. 11 where NFET epi growth takes place, in accordance with an embodiment of the present invention.

In various embodiments, the BCP 48 and the PS layer 50 are removed and NFET epi growth 56 takes place. Additionally, the OPL 52 is etched away. The removal of the BCP 48 and the PS layer 50 results in the exposure of a sidewalls 19 of the block mask 18. The NFET epi growth 56 takes place between the dummy gates 16 and, specifically, adjacent the small amount of the nitride layer regions 20' of the NFET portion 7 remaining intact against the sidewalls of the dummy gates 16. The NFET epi growth 56 extends a distance "D4" into the second semiconductor material portion 12 (NFET device). The height of the NFET epi growth 56 can be approximately equal to the height of the PFET epi growth 36. The depth "D4" of the NFET device 12 can be approximately equal to the depth "D3" of the PFET device 10 (FIG. 7). The thickness of the NFET epi growth 56 between the dummy gates 16 (of the NFET) can be approximately equal to the thickness of the PFET epi growth 36 between the dummy gates 16 (of the PFET).

Figure 13:
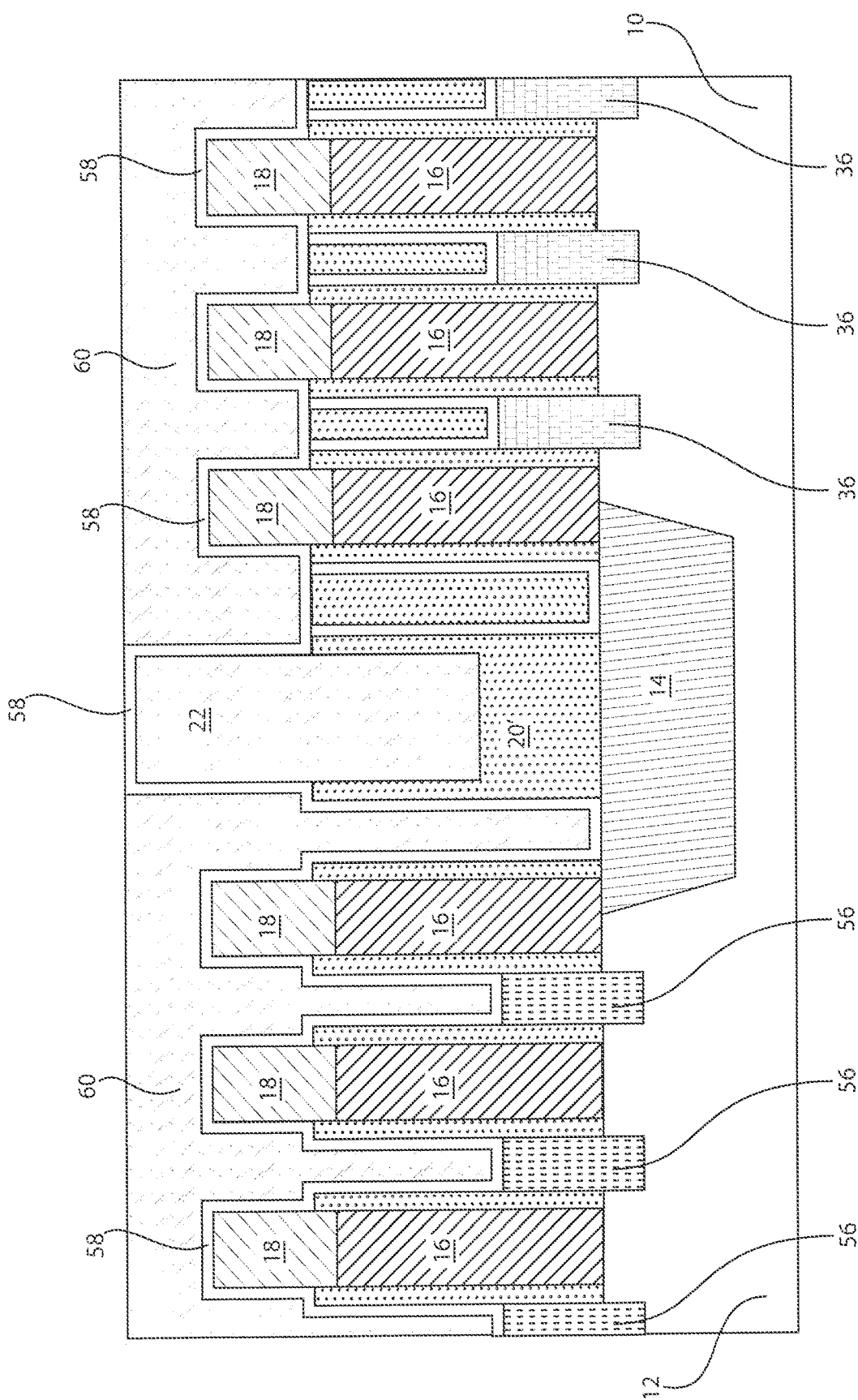
FIG. 13 is a cross-sectional view of the semiconductor device of FIG. 12 where a nitride liner and an oxide are deposited, in accordance with an embodiment of the present invention.

FIG. 13 is a cross-sectional view of the semiconductor device of FIG. 12 where a nitride liner and an oxide are deposited, in accordance with an embodiment of the present invention.

In various embodiments, a nitride liner 58 is deposited and then an oxide 60 deposition takes place. The oxide 60 can be, e.g., an inter-level dielectric (ILD), as described above. The ILD oxide 60 is planarized. The ILD oxide 60 fills the remaining gap or recess between the dummy gates 16 of the NFET portion 7. Moreover, after this step, the dielectric is continued to be polished, and the a-Si dummy gate 16 is exposed. Then the dummy gate 16 is selectively removed, and a replacement HKMG is formed. After HKMG is deposited, it is planarized and recessed, followed by nitride deposition and CMP to form a nitride cap.

Figure 14:
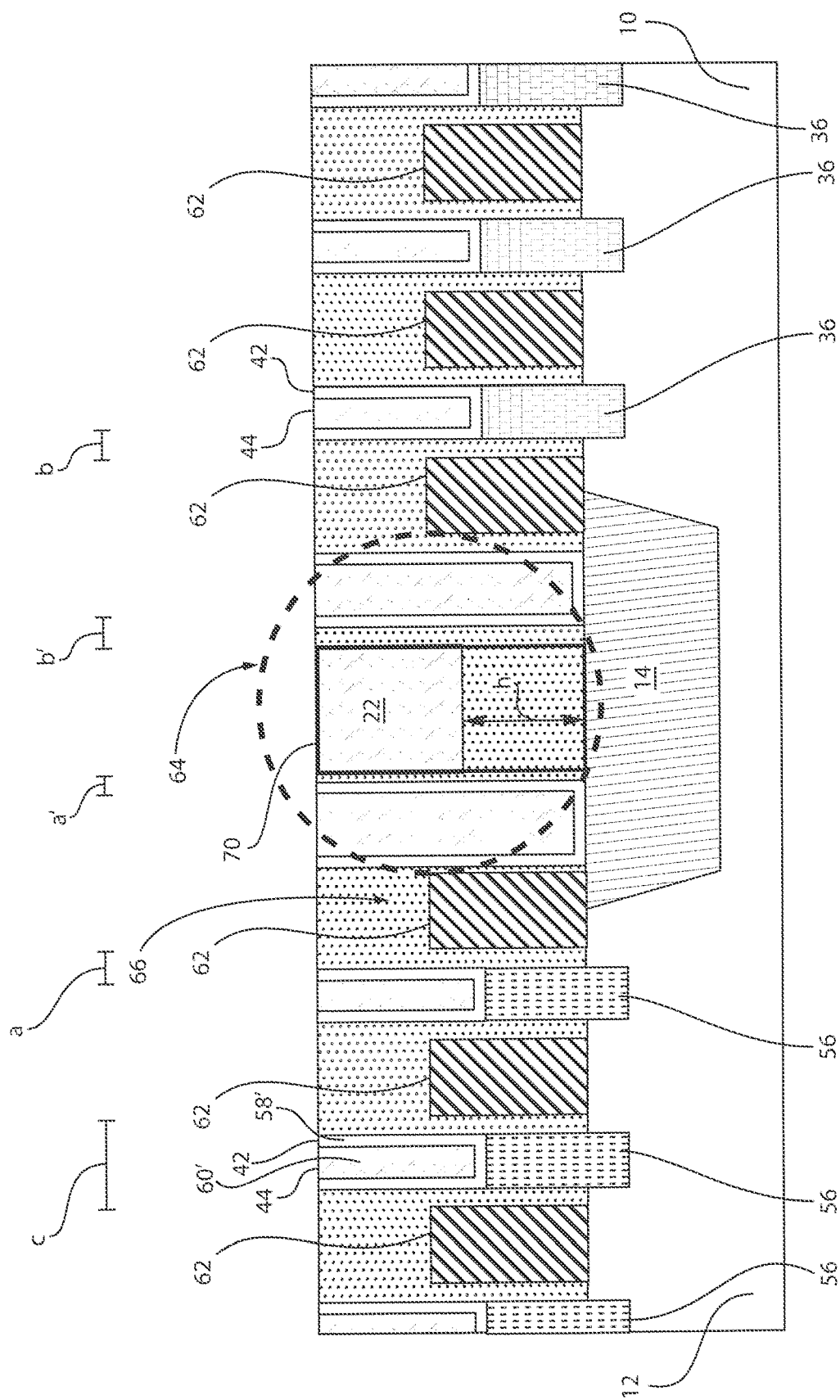
FIG. 14 is a cross-sectional view of the semiconductor device of FIG. 13 where high-k metal gates (HKMGs) are formed, in accordance with an embodiment of the present invention.

FIG. 14 is a cross-sectional view of the semiconductor device of FIG. 13 where high-k metal gates (HKMGs) are formed, in accordance with an embodiment of the present invention.

In various embodiments, a portion of the oxide 60 and the nitride liner 58 are selectively removed to expose a top surface 17 of the block masks 18, as well as the sidewall surfaces 19 of the block masks 18. In the NFET portion 7, the top surface 42 of the nitride liner 58' and the top surface 44 of the oxide 60' are exposed. The selective removal results in nitride liner 58' and oxide 60' remaining between the dummy gates 16.

After formation of the RMG (replacement metal gate) module, a high-k metal gate (HKMG) 62 replaces each of the dummy gates 16. The HKMGs 62 are formed between the epi growth 36 in the PFET portion 9 and between the epi growths 56 in the NFET portion 7. A gate cap is formed in the region 66. The structure 64 is a gate spacer that enables separation between the NFET and PFET portions of the structure.

Therefore, a dielectric island 70 is formed in between the NFET device and the PFET device on STI region, where its height h is greater than or equal to half of the gate to gate spacing c (because the initial first dielectric 20 deposition must pinch-off the space c). Moreover, a sidewall spacer is formed at each side of the dielectric island 70. The NFET side spacer width a' is equal to the NFET device spacer width a; the PFET side spacer width b' is equal to PFET device spacer width b, such that a=b.

Thus, a replacement metal gate CMOS device structure with equal thickness gate sidewall spacers on PMOS as well as NMOS devices can be fabricated by using directed self-assembly and RIE, thereby avoiding high aspect ratio tri-layer patterning and deposition of multiple layers between tight spaces between adjacent gates.

In various embodiments, the HKMG 62 can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, the HKMG 62 can have a thickness in the range of about 1.5 nm to about 2.5 nm.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to form semiconductor devices having equal thickness gate spacers (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor structure comprising:
   a p-type field effect transistor (PFET) device;
   an n-type field effect transistor (NFET) device;
   a dielectric island disposed between the PFET and NFET devices;
   a PFET sidewall spacer disposed on one side of the dielectric island; and
   an NFET sidewall spacer disposed on the other side of the dielectric island;
   wherein the NFET sidewall spacer has a width equal to a width of the PFET sidewall spacer, and
   wherein the dielectric island, the PFET sidewall spacer, and the NFET sidewall spacer are vertically aligned with a single common shallow trench isolation (STI) region and wherein the dielectric island directly contacts a top surface of the STI region.

2. The semiconductor structure of claim 1, wherein a height of the dielectric island is greater than or equal to half of a gate-to-gate spacing.

3. The semiconductor structure of claim 1, wherein an NFET device spacer has a width equal to a width of the NFET sidewall spacer and a PFET device spacer has a width equal to a width of the PFET sidewall spacer.

4. The semiconductor structure of claim 1, wherein a first high-k metal gate (HKMG) is disposed adjacent the PFET sidewall spacer and a second HKMG is disposed adjacent the NFET sidewall spacer.

5. The semiconductor structure of claim 1, wherein the PFET sidewall spacer and the NFET sidewall spacer directly contact a top surface of the STI region.

6. The semiconductor structure of claim 5, wherein the PFET sidewall spacer and the NFET sidewall spacer are formed within nitride liners.

7. A semiconductor structure comprising:
a p-type field effect transistor (PFET) device;
an n-type field effect transistor (NFET) device;
a gate spacer structure separating the PFET device from the NFET device; and
sidewall spacers disposed on opposed ends of the gate spacer structure,
wherein the gate spacer structure and the sidewall spacer are vertically aligned with a single common shallow trench isolation (STI) region and wherein the gate spacer structure directly contacts a top surface of the STI region.

8. The semiconductor structure of claim 7, wherein the PFET device includes a first set of epi growth regions.

9. The semiconductor structure of claim 8, wherein first nitride liners directly contact a top surface of each of the first set of epi growth regions of the PFET device.

10. The semiconductor structure of claim 9, wherein each of the first nitride liners defines a substantially U-shaped configuration.

11. The semiconductor structure of claim 10, wherein the U-shaped configuration includes an oxide therein.

12. The semiconductor structure of claim 11, wherein the NFET device includes a second set of epi growth regions.

13. The semiconductor structure of claim 12, wherein second nitride liners directly contact a top surface of each of the second set of epi growth regions of the NFET device.

14. The semiconductor structure of claim 7, wherein the sidewall spacer of the NFET has a width equal to a width of the sidewall spacer of the PFET.

15. The semiconductor structure of claim 7, wherein a height of a dielectric island of the gate spacer structure is greater than or equal to half of a gate-to-gate spacing.

16. The semiconductor structure of claim 7, wherein a width of the sidewall spacers is greater than a width of a first set of epi growth regions of the PFET device.

17. The semiconductor structure of claim 16, wherein the width of the sidewall spacers is greater than a width of a second set of epi growth regions of the NFET device.

18. The semiconductor structure of claim 7, wherein the sidewall spacers directly contact a top surface of the STI region.

* * * * *